United States Patent
Yang et al.

(10) Patent No.: US 12,087,633 B2
(45) Date of Patent: Sep. 10, 2024

(54) MULTI-GATE FIELD-EFFECT TRANSISTORS AND METHODS OF FORMING THE SAME

(71) Applicant: Taiwan Semiconductor Manufacturing Company, Ltd., Hsin-Chu (TW)

(72) Inventors: Chih-Chuan Yang, Hsinchu (TW); Chia-Hao Pao, Kaohsiung (TW); Kuo-Hsiu Hsu, Taoyuan County (TW); Shih-Hao Lin, Hsinchu (TW); Shang-Rong Li, Hsinchu (TW); Ping-Wei Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 373 days.

(21) Appl. No.: 17/464,398

(22) Filed: Sep. 1, 2021

(65) Prior Publication Data
US 2022/0352334 A1 Nov. 3, 2022

Related U.S. Application Data

(60) Provisional application No. 63/181,773, filed on Apr. 29, 2021.

(51) Int. Cl.
*H01L 21/8234* (2006.01)
(52) U.S. Cl.
CPC ............. *H01L 21/823418* (2013.01); *H01L 21/823412* (2013.01)

(58) Field of Classification Search
CPC ..... H01L 21/823412; H01L 21/823418; H01L 29/42392; H01L 29/78696; H01L 29/0847; H01L 29/0673; H01L 29/36; H01L 29/775; H01L 29/66439; H01L 29/1079; H01L 29/42376
See application file for complete search history.

(56) References Cited

U.S. PATENT DOCUMENTS

| | | |
|---|---|---|
| 10,170,638 B1 * | 1/2019 | Reznicek ............ H01L 29/0649 |
| 2019/0067125 A1 | 2/2019 | Chiang et al. |
| 2019/0131180 A1 | 5/2019 | Van Dal et al. |
| 2020/0135932 A1 | 4/2020 | Wang et al. |

* cited by examiner

*Primary Examiner* — Changhyun Yi
(74) *Attorney, Agent, or Firm* — HAYNES AND BOONE, LLP

(57) ABSTRACT

A method of forming a semiconductor structure includes forming a fin structure having a stack of alternating first semiconductor layers and second semiconductor layers over a substrate, forming cladding layers along sidewalls of the fin structure, forming a dummy gate stack over the cladding layers, and forming source/drain (S/D) features in the fin structure and adjacent to the dummy gate stack. The method further includes removing the dummy gate stack to form a gate trench adjacent to the S/D features, removing the cladding layers to form first openings along the sidewalls of the fin structure, where the first openings extend to below the stack, removing the first semiconductor layers to form second openings between the second semiconductor layers and adjacent to the first openings, and subsequently forming a metal gate stack in the gate trench, the first openings, and the second openings.

20 Claims, 15 Drawing Sheets

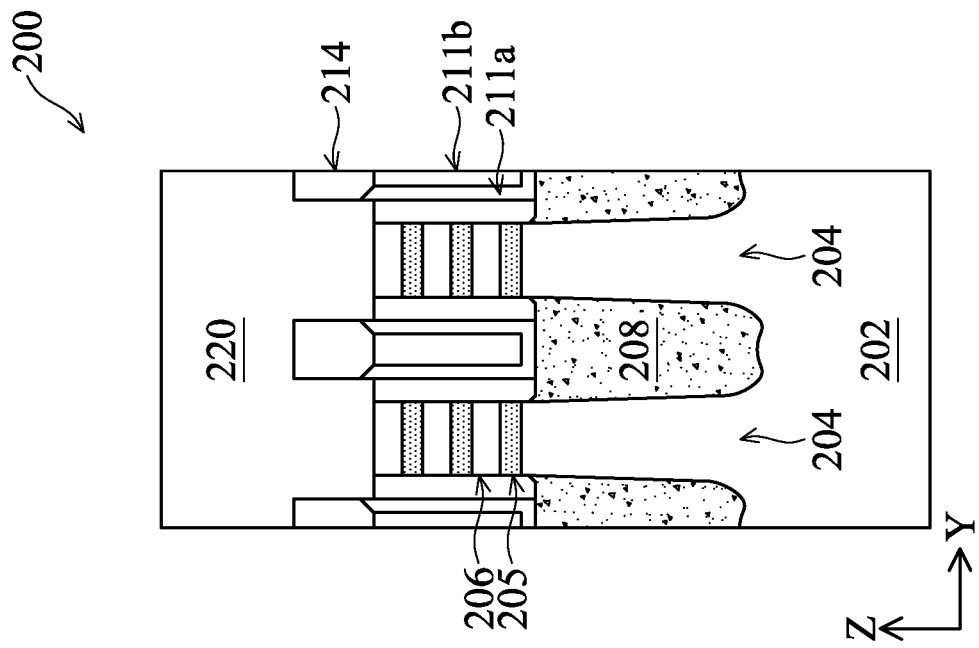
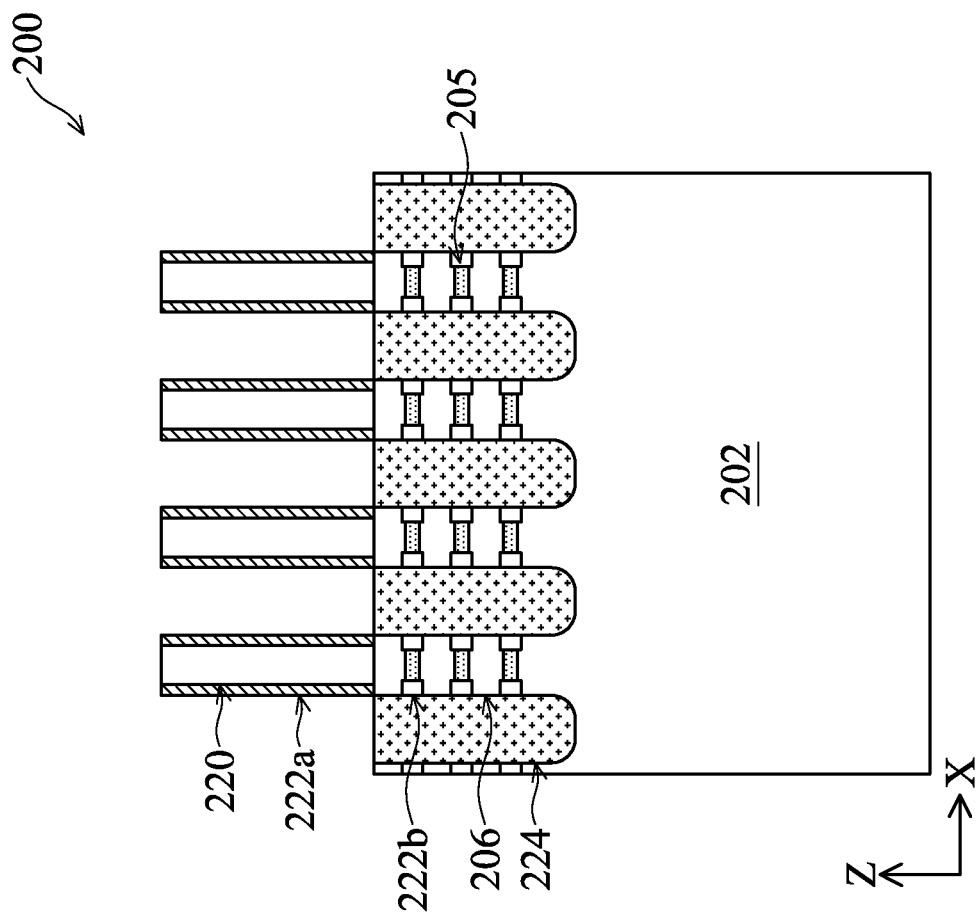
FIG. 7A
FIG. 7B

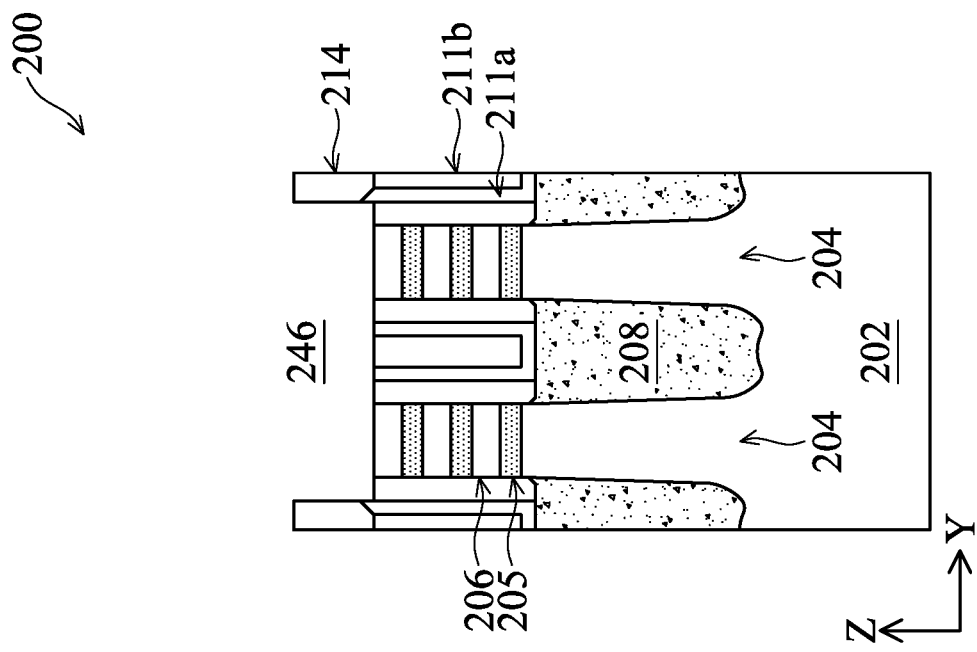
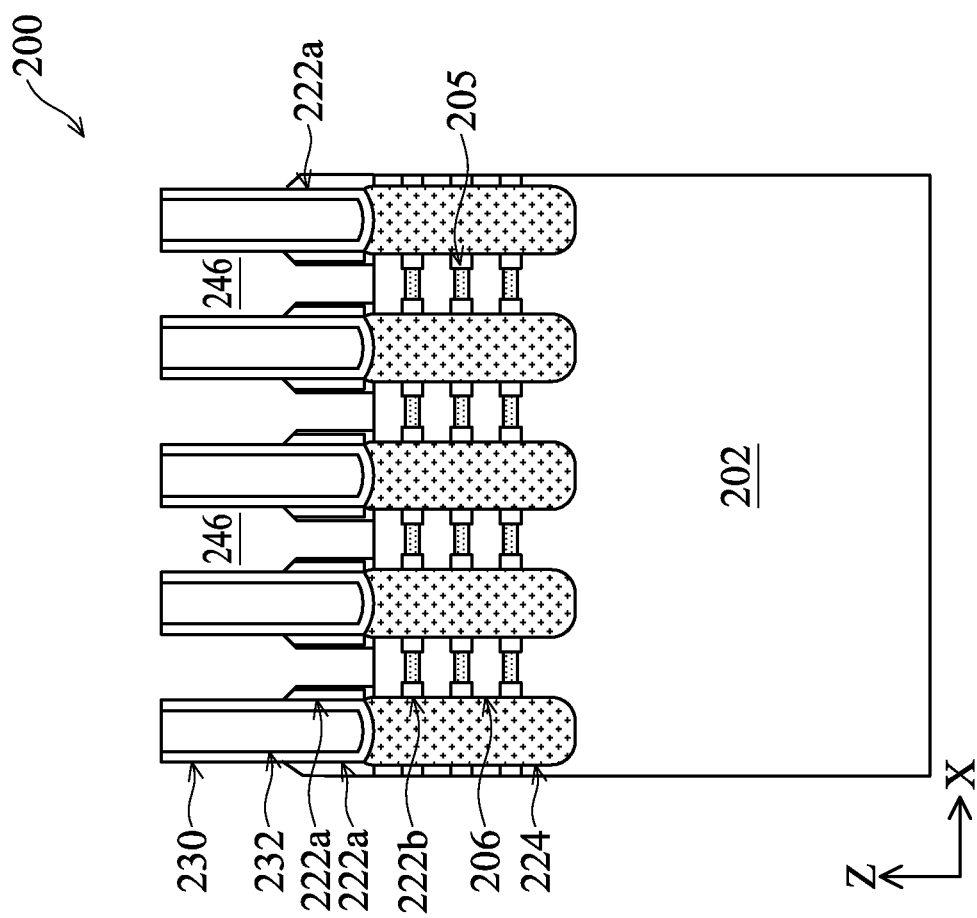
FIG. 8A
FIG. 8B

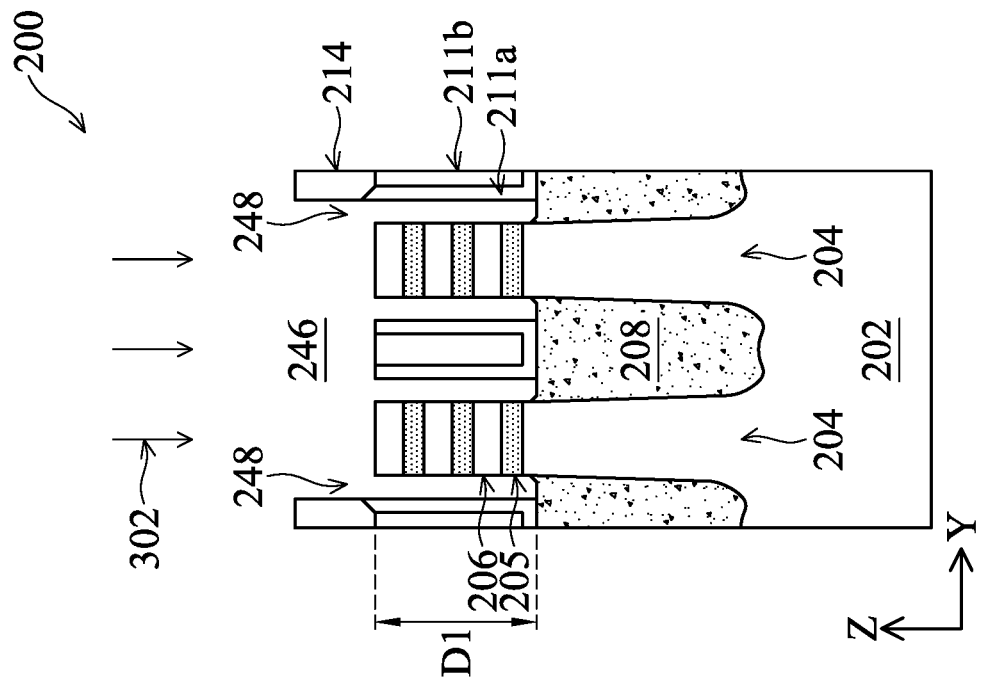
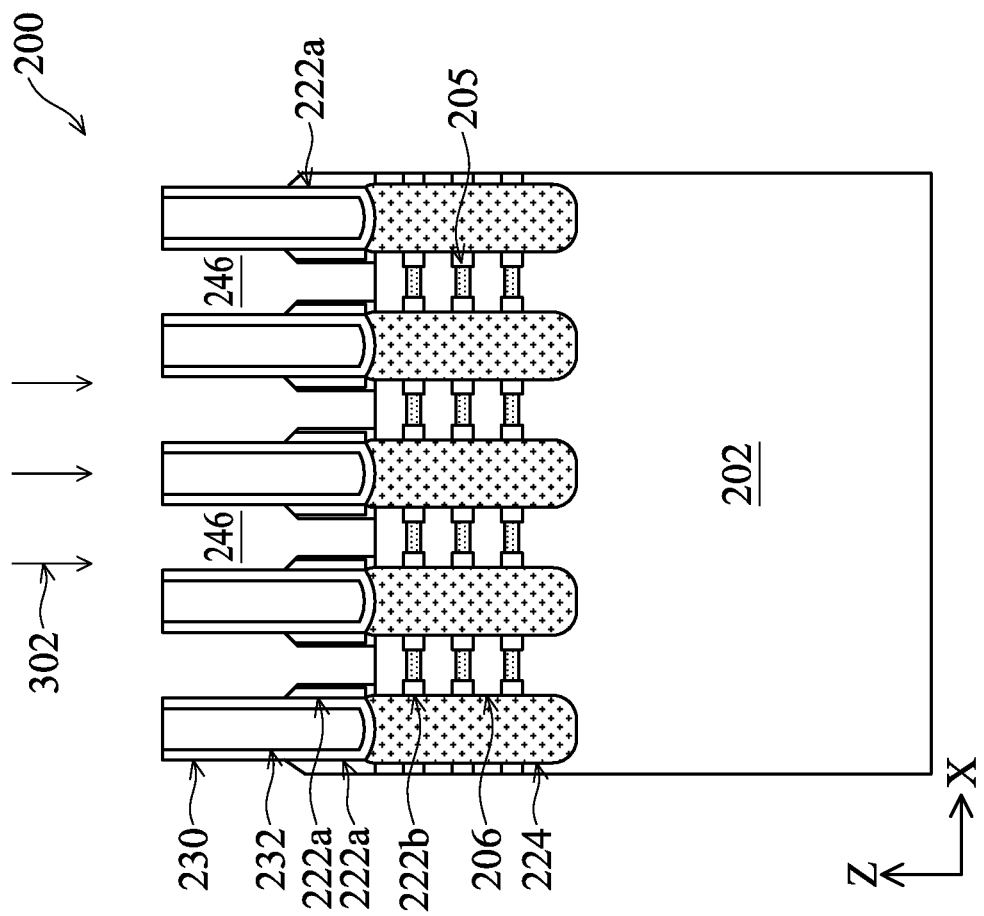
FIG. 9A
FIG. 9B

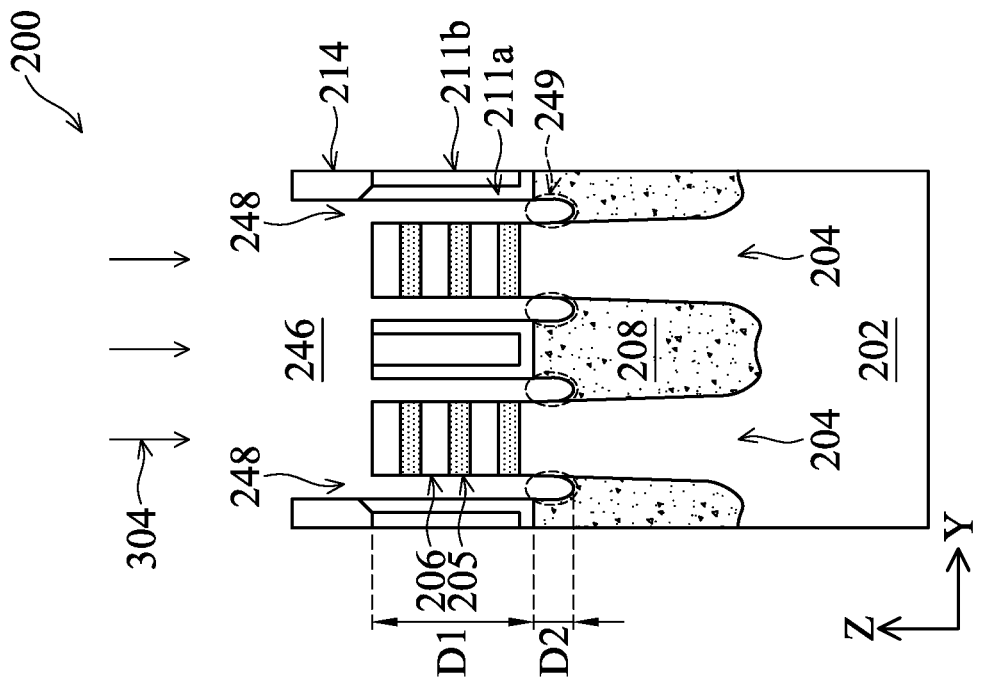
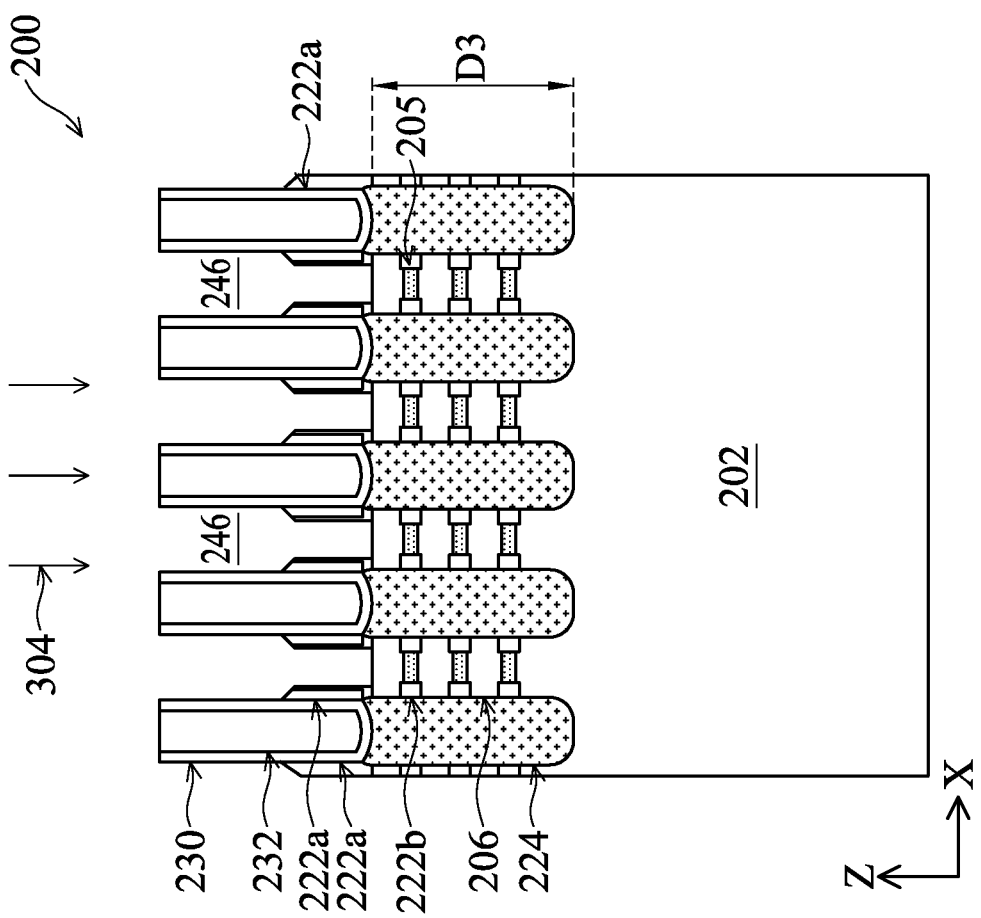
FIG. 10A
FIG. 10B

US 12,087,633 B2

MULTI-GATE FIELD-EFFECT TRANSISTORS AND METHODS OF FORMING THE SAME

CROSS-REFERENCE TO RELATED APPLICATIONS

This application claims priority to the U.S. Provisional Application Ser. No. 63/181,773, filed Apr. 29, 2021 and titled "Multi-Gate Field-Effect Transistors and Methods of Forming the Same," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

A nanosheet field-effect transistor (NS FET or alternatively referred to as a gate-all-around, or GAA, FET), which is a type of a multi-gate transistor, may generally include a stack of channel layers (such as Si layers) disposed over an active region (e.g., a fin), source/drain (S/D) features formed over or in the active region, and a metal gate stack interleaved with the stack of channel layers and interposed between the S/D features. While existing NS FETs have been generally adequate, they have not been entirely satisfactory in all aspects. For example, in NS FETs, poor gate control from a device formed from the bottommost channel layer in the stack may lead to leakage issues that negatively impact device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 7C, 7D, 8A, 9A, 10A, 11A, and 12A are cross-sectional views of the semiconductor device taken along line AA' as shown in FIG. 2 during intermediate stages of the method shown in FIGS. 1A and/or 1B according to various embodiments of the present disclosure.

FIGS. 3B, 4B, 5B, 6B, 7B, 8B, 9B, 10B, 11B, 11C, 11C-1, 11C-2, and 12B are cross-sectional views of the semiconductor device taken along line BB' as shown in FIG. 2 during intermediate stages of the method shown in FIGS. 1A and/or 1B according to various embodiments of the present disclosure.

FIG. 11D is a cross-sectional view of the semiconductor device taken along line CC' as shown in FIG. 2 during intermediate stages of the method shown in FIGS. 1A and/or 1B according to various embodiments of the present disclosure.

DETAILED DESCRIPTION

Figure 1A:
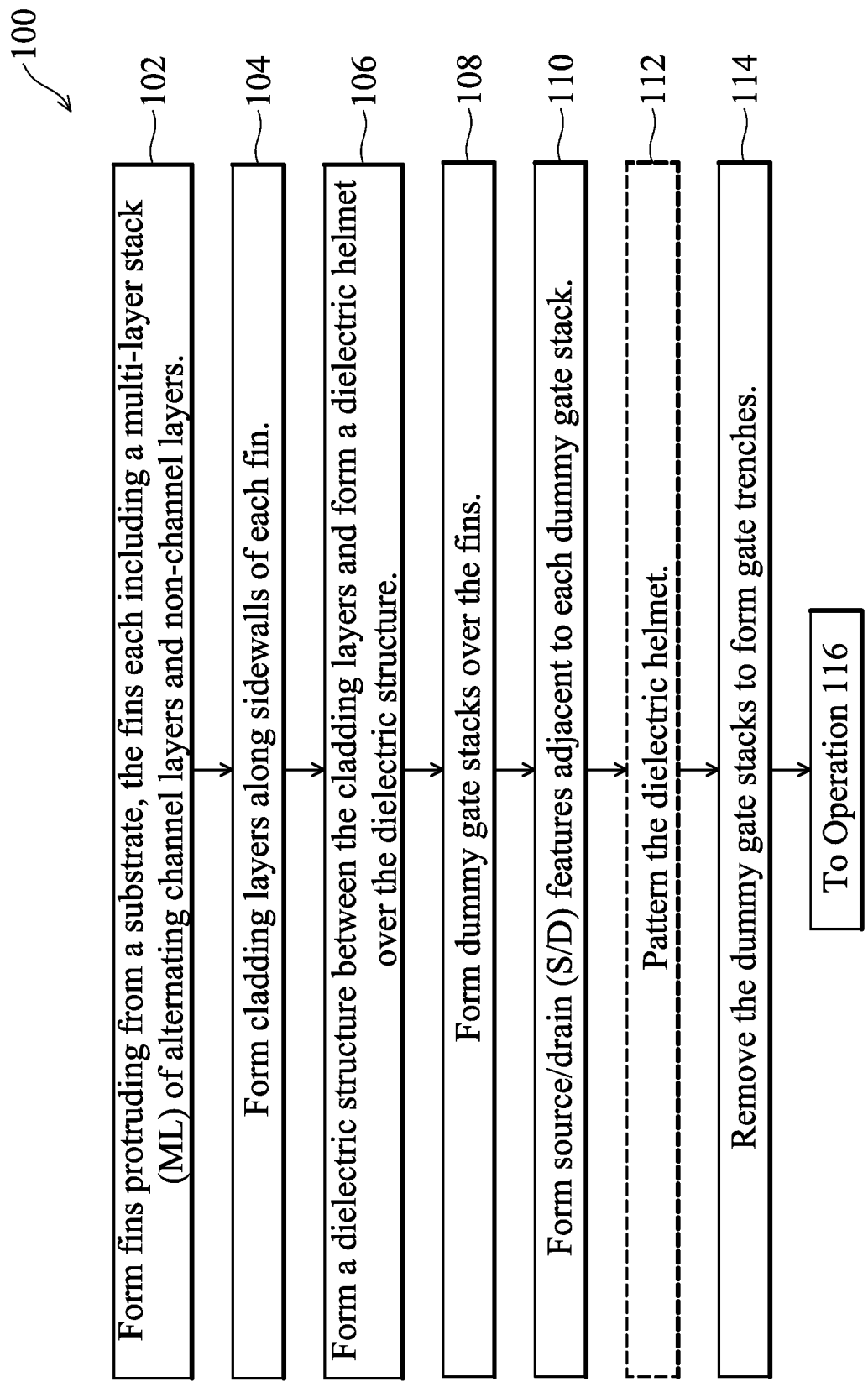
FIGS. 1A and 1B illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to FETs, such as three-dimensional NS FETs, in memory and/or standard logic cells of an IC structure. Generally, an NS FET includes a plurality of vertically stacked sheets (e.g., nanosheets), wires (e.g., nanowires), or rods (e.g., nanorods) in a channel region of the FET. The present disclosure includes multiple embodiments. Different embodiments may have different advantages, and no particular advantage is necessarily required of any embodiment.

Figure 1B:
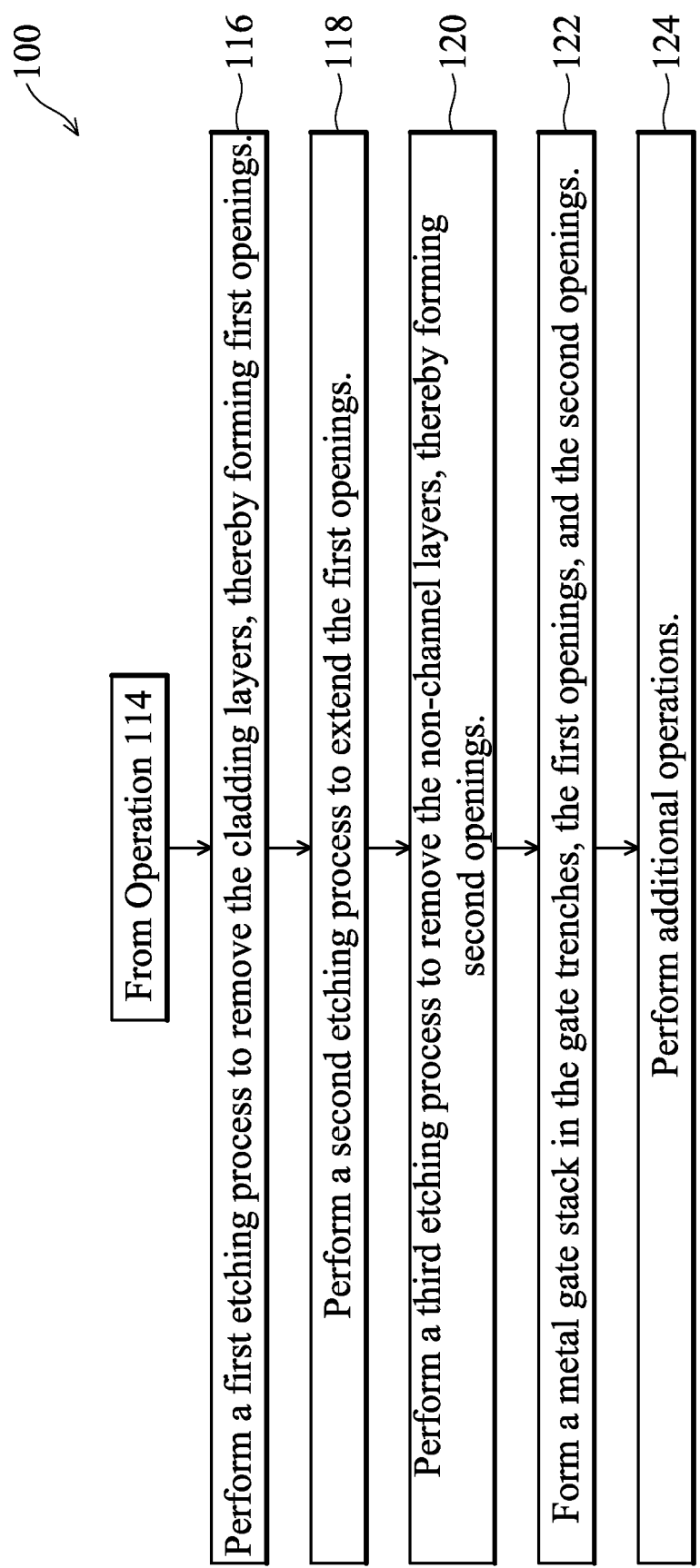
Figure 2:
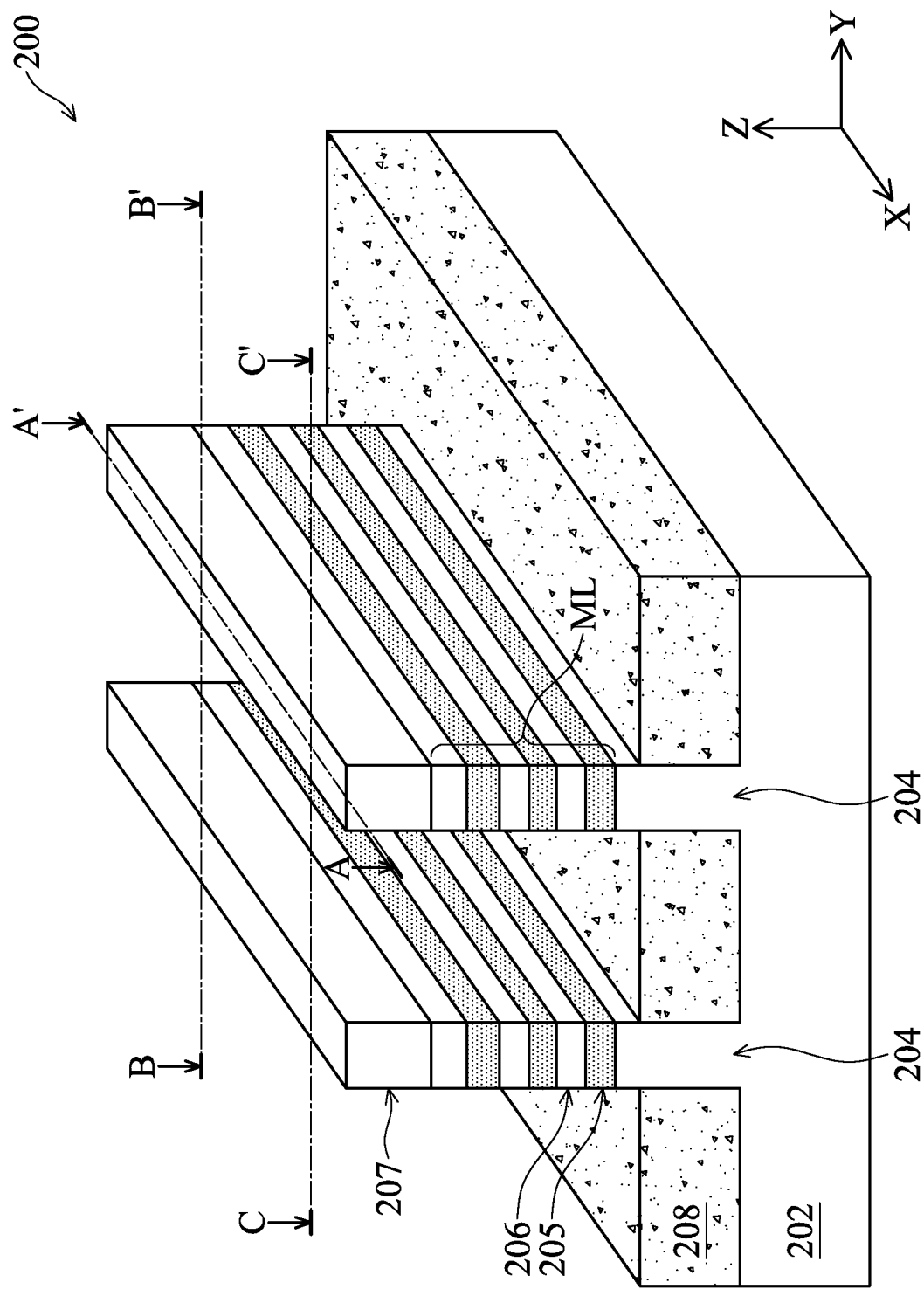
FIG. 2 is a three-dimensional perspective view of a portion of an example semiconductor device according to various embodiments of the present disclosure.

Referring now to FIGS. 1A and 1B collectively, a flowchart of a method 100 of forming a semiconductor structure 200 (hereafter simply referred to as the structure 200) is illustrated according to various aspects of the present disclosure. Method 100 is merely an example and is not intended to limit the present disclosure beyond what is explicitly recited in the claims. Additional operations can be provided before, during, and after method 100, and some operations described can be replaced, eliminated, or moved around for additional embodiments of the method. Method 100 are described below in conjunction with FIGS. 3A-12B, which are various cross-sectional and top planar views of the structure 200 as shown in FIG. 2 at intermediate steps of method 100. For examples, FIGS. 3A, 4A, 5A, 6A, 7A, 7C, 7D, 8A, 9A, 10A, 11A, and 12A are cross-sectional views of the structure 200 taken along line AA' as shown in FIG. 2, FIGS. 3B, 4B, 5B, 6B, 7B, 8B, 9B, 10B, 11B, 11C, and 12B are cross-sectional views of the structure 200 taken along line BB' (i.e., through a channel region of fins 204) as shown in FIG. 2, and FIG. 11D is a cross-sectional view of the structure 200 taken along line CC' (i.e., through an S/D region of fins 204) as shown in FIG. 2.

The structure 200 may be an intermediate device fabricated during processing of an IC, or a portion thereof, that may comprise static random-access memory (SRAM) and/or other logic circuits, passive components such as resistors, capacitors, and inductors, and active components such as NS FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the structure 200 includes one or more NS FETs. The present disclosure is not limited to any particular number of devices or device regions, or to any particular device configurations. Additional features can be added to the structure 200, and some of the features described below can be replaced, modified, or eliminated in other embodiments of the structure 200.

Figure 3B:
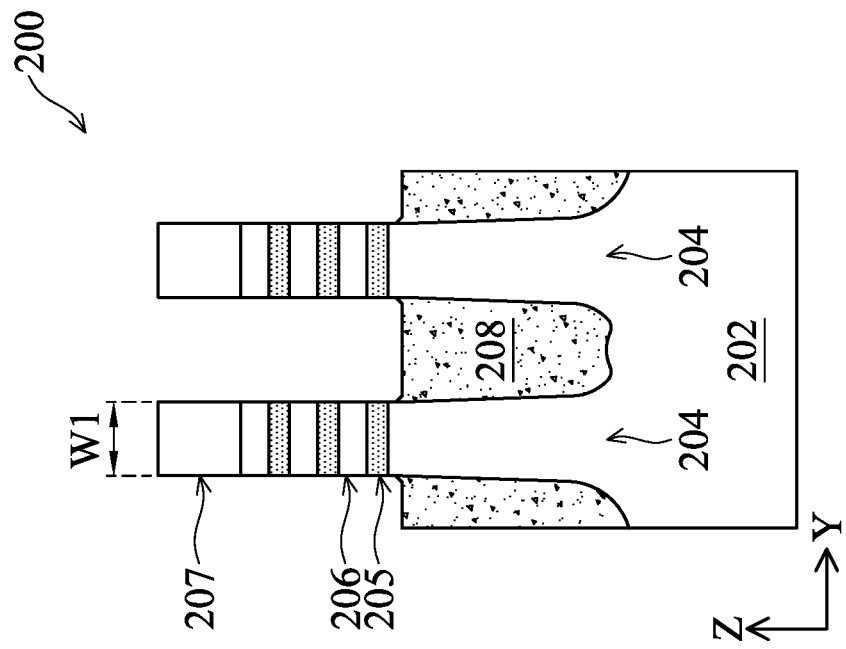

At operation 102, referring to FIGS. 2-3B, method 100 forms the structure 200 that includes multiple active three-dimensional device regions 204 (hereafter referred to as fins 204) protruding from a semiconductor substrate 202 (hereafter referred to as the substrate 202), where the fins 204 are separated by isolation features 208.

The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

Figure 3A:
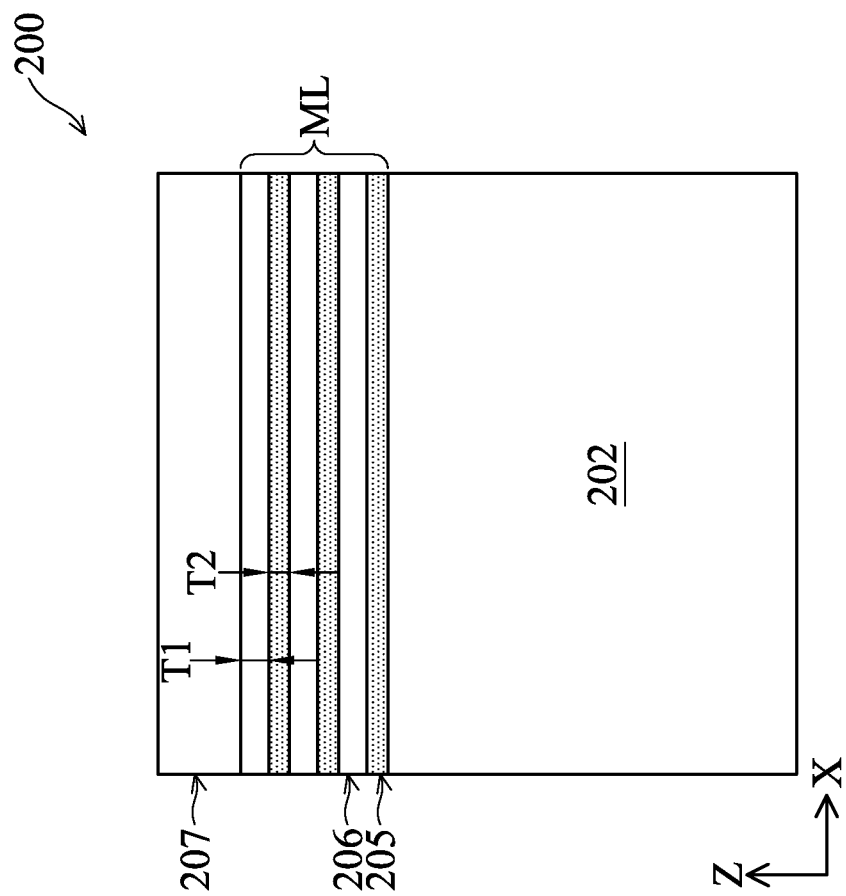

In the present embodiments, referring to FIGS. 2 and 3A, each fin 204 includes a multi-layer structure (ML) of alternating non-channel layers (or sacrificial layers) 205 and channel layers 206 stacked vertically over protruding portions of the substrate 202, as well as a hard mask layer 207 over the ML. In the present embodiments, the non-channel layers 205 are sacrificial layers configured to be removed at a subsequent processing step, thereby providing openings between the channel layers 206 for forming a metal gate stack therein. Each channel layer 206 may include a semiconductor material such as, for example, Si, Ge, SiC, SiGe, GeSn, SiGeSn, SiGeCSn, other suitable semiconductor materials, or combinations thereof, while each non-channel layer 205 has a composition different from that of the channel layer 206. In one such example, the channel layer 206 may include elemental Si and the non-channel layer 205 may include SiGe. In another example, the channel layer 206 may include elemental Si and the non-channel layer 205 may include elemental Ge. In some examples, each fin 204 may include a total of three to ten pairs of alternating non-channel layers 205 and channel layers 206. Other configurations may also be applicable depending upon specific design requirements. In some embodiments, each channel layer 206 is formed to a thickness that is less than that of each non-channel layer 205, which defines the dimension of an opening that is formed after removing the channel layer 206. In some examples, a thickness T1 of each channel layer 206 may be about 4 nm to about 5 nm and a thickness T2 of each non-channel layer 205 may be about 9 nm to about 12 nm.

In the present embodiments, the hard mask layer 207 is a sacrificial layer configured to facilitate the formation of a gate isolation feature (discussed in detail below) and subsequently be removed from the structure 200. As such, a thickness of the hard mask layer 207 may be adjusted based on the desired thickness of the gate isolation feature. In some embodiments, the thickness of the hard mask layer 207 is greater than a thickness of the non-channel layers 205 and the channel layers 206. The hard mask layer 207 may include any suitable material, such as a semiconductor material, so long as its composition is different from that of the subsequently-formed gate isolation feature and the channel layer 206 disposed thereunder to allow selective removal by an etching process. In some embodiments, the hard mask layer 207 has a composition similar to or the same as that of the non-channel layers 205 and includes, for example, SiGe.

In the present embodiments, forming the ML includes alternatingly growing the non-channel layers 205 and the channel layers 206 in a series of epitaxy processes. The epitaxy processes may be implemented by chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing a suitable material (e.g., Ge for the non-channel layers 205), which interact with the composition of the underlying substrate, e.g., the substrate 202. In some examples, the non-channel layers 205 and the channel layers 206 may be formed into nanosheets, nanowires, or nanorods. A sheet (or wire) release process may then be implemented to remove the non-channel layers 205 to form openings between the channel layers 206, and a metal gate stack is subsequently formed in the openings, thereby providing an NS FET. For embodiments in which the hard mask layer 207 has the same composition as the non-channel layers 205, the hard mask layer 207 may also be formed by a similar epitaxy process as discussed herein.

In the present embodiments, the fins 204 are fabricated from the ML (and the hard mask layer 207 disposed thereover) using a series of photolithography and etching processes. For example, the photolithography process may include forming a photoresist layer overlying the ML, exposing the photoresist layer to a pattern, performing post-exposure bake processes, and developing the exposed photoresist layer to form a patterned masking element (not depicted). The ML is then etched using the patterned masking element as an etch mask, thereby leaving the fins 204 protruding the substrate 202. The etching process may include dry etching, wet etching, reactive ion etching (RIE), other suitable processes, or combinations thereof. The patterned masking element is subsequently removed from the ML using any suitable process, such as ashing and/or resist stripping. In some examples, each fin 204 may be formed to a width W1 of about 8 nm to about 60 nm.

Numerous other embodiments of methods to form the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 202 and patterned using a photolithography process. Spacers are formed alongside the patterned sacrificial layer using a self-aligned process. The sacrificial layer is then removed, and the remaining spacers, or mandrels, may then be used to pattern the fins 204.

The isolation features 208 may include silicon oxide (SiO and/or $SiO_2$), tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The isolation features 208 may include shallow trench isolation (STI) features. In some embodiments, the isolation features 208 are formed by filling trenches that separate the fins 204 with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation features 208. The isolation features 208 may include a single-layer structure or a multi-layer structure.

Figure 4B:
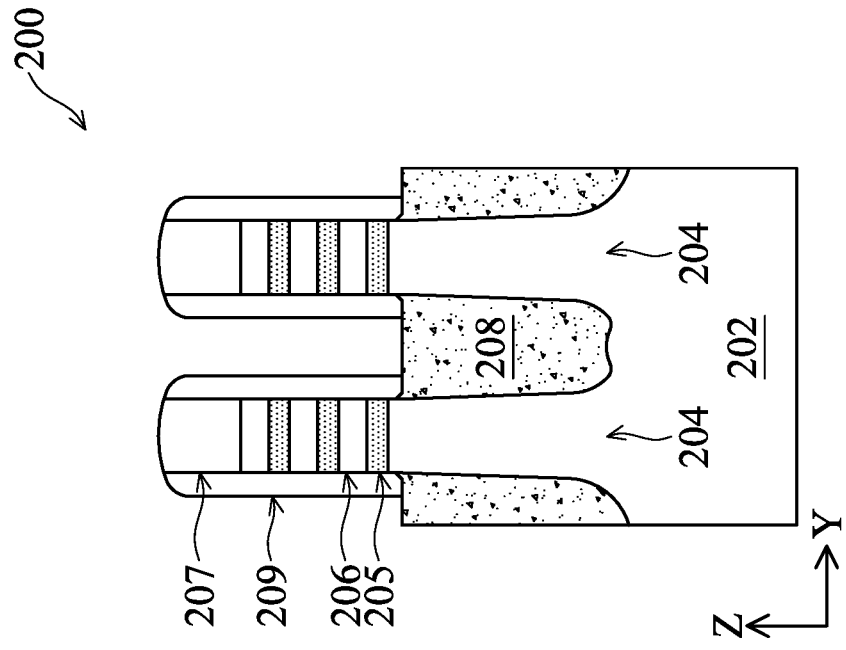
Figure 4A:
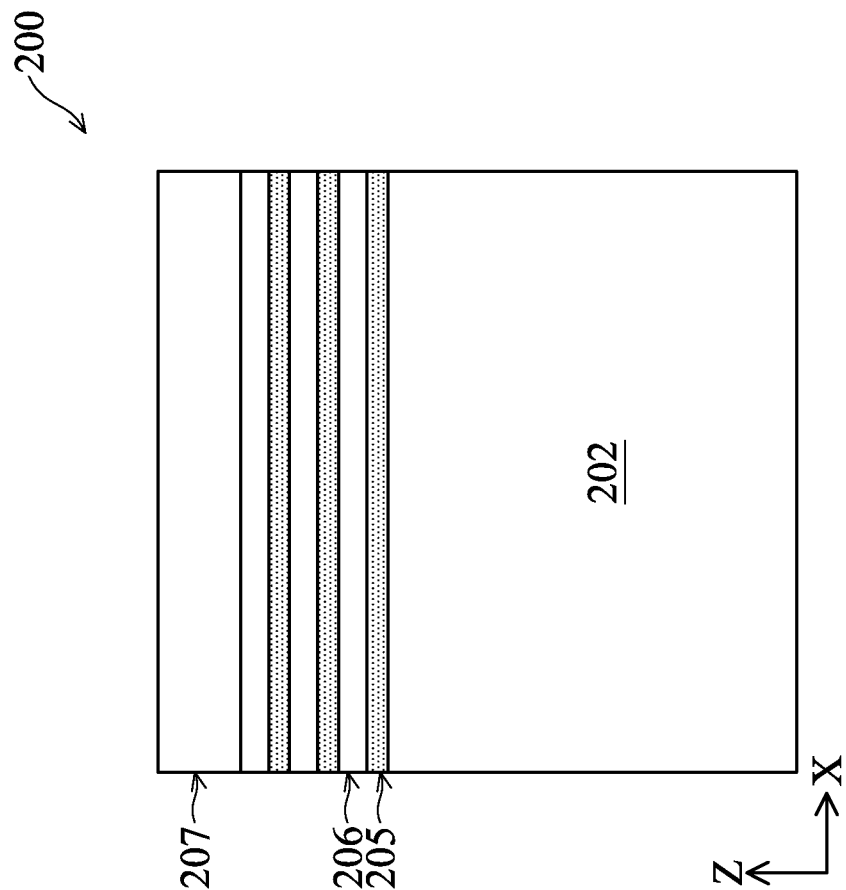

At operation 104, referring to FIGS. 4A and 4B, method 100 forms cladding layers 209 along sidewalls of the fins 204. In the present embodiments, the cladding layers 209 and the non-channel layers 205 are sacrificial layers configured to be replaced with a metal gate stack in a channel region of the fin 204. In the present embodiments, the cladding layers 209 have the same composition as the non-channel layers 205 and include SiGe. In some embodiments, the cladding layers 209 are grown epitaxially by a suitable method discussed above with respect to forming the ML. In some embodiments, the cladding layers 209 are deposited conformally, rather than grown epitaxially, over surfaces of the structure 200 as a blanket amorphous layer. In some examples, the cladding layers 209 may be formed to a thickness of about 5 nm to about 10 nm. Subsequently, method 100 performs an etching process to selectively remove portions of the cladding layer 209, thereby exposing portions of the isolation features 208 and a top surface of the hard mask layer 207. The etching process may include a dry etching process, a wet etching process, an RIE process, or combinations thereof.

Figure 5B:
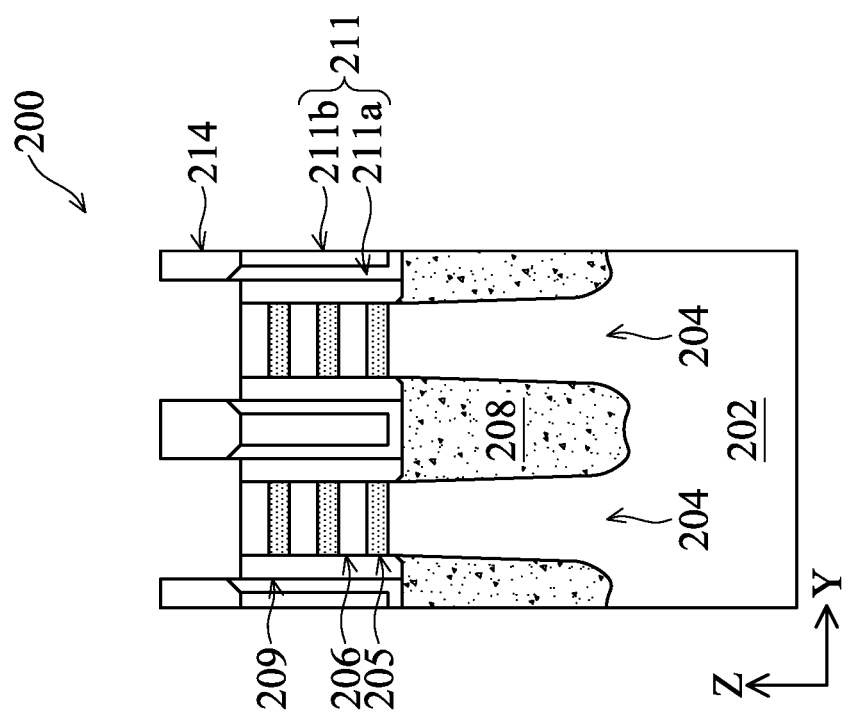
Figure 5A:
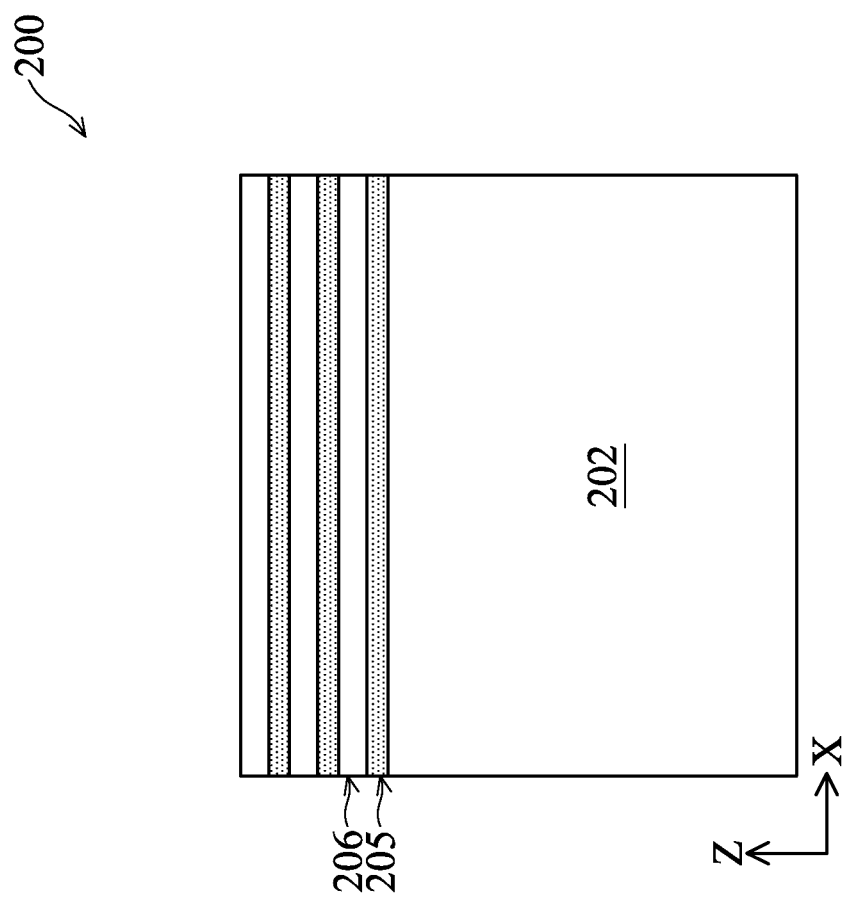

At operation 106, referring to FIGS. 5A and 5B, method 100 forms a dielectric structure 211 over the structure 200, thereby filling the space between the cladding layers 209. The dielectric structure 211 is configured to isolate adjacent fins 204 and to provide a substrate over which a dielectric helmet may be formed before forming dummy gate stacks. The dielectric structure 211 may include any suitable material, such as SiO and/or $SiO_2$, silicon nitride (SiN), silicon carbide (SiC), oxygen-containing silicon nitride (SiON), oxygen-containing silicon carbide (SiOC), carbon-containing silicon nitride (SiCN), FSG, a low-k dielectric material, other suitable materials, or combinations thereof. In some embodiments, the dielectric structure 211 has a composition similar to or the same as that of the isolation features 208. The dielectric structure 211 may include a single-layer structure or a multi-layer structure as depicted herein, where the dielectric structure 211 includes a sub-layer 211b disposed over a sub-layer 211a. In some embodiments, the sub-layer 211a includes a nitrogen-containing dielectric material, such as SiN and/or SiCN, and the sub-layer 211b includes an oxygen-containing dielectric material, such as SiO and/or $SiO_2$. The dielectric structure 211 (or each sub-layer thereof) may be deposited by any suitable method, such as CVD, FCVD, SOG, other suitable methods, or combinations thereof, and subsequently planarized by one or more CMP processes, such that a top surface of the dielectric structure 211 is substantially co-planar with a top surface of the hard mask layer 207.

Subsequently, still referring to FIGS. 5A and 5B, method 100 at operation 106 forms a dielectric helmet 214 over the dielectric structure 211. The dielectric helmet 214 may include SiN, SiC, SiON, SiOC, SiCN, $Al_2O_3$, SiO and/or $SiO_2$, a high-k dielectric material (having a k value greater than that of silicon oxide, which is about 3.9), other suitable materials, or combinations thereof. The dielectric helmet 214 may include a single-layer structure or a multi-layer structure.

Method 100 may form the dielectric helmet 214 by first recessing a top portion of the dielectric structure 211 to form trenches, such that a top surface of the recessed dielectric structure 211 is substantially co-planar with the topmost channel layer 206. In other words, the resulting trenches (not depicted) formed over the recessed dielectric structure 211 each have a thickness corresponding to the thickness of the hard mask layer 207. The etching process may include any suitable process, such as a dry etching process, a wet etching process, an RIE process, other suitable processes, or combinations thereof. Then, method 100 proceeds to depositing one or more dielectric materials in the trenches and performing a CMP process to form the dielectric helmet 124 between the hard mask layer 207. The one or more dielectric materials may be deposited by any suitable method, such as CVD, FCVD, ALD, other suitable methods, or combinations thereof. Subsequently, method 100 removes the hard mask layer 207 from the structure 200 to expose the topmost channel layer 206 of the ML. As such, the dielectric helmet 214 protrude from top surfaces of the fins 204. In the present embodiments, method 100 selectively removes the hard mask layer 207 without removing, or substantially removing, the dielectric helmet 214 and the topmost channel layer 206 of the ML.

In the present embodiments, the dielectric helmet 214 is configured to provide isolation for the subsequently-formed metal gate stack over the fins 204. In other words, portions of the dielectric helmet 214 may be configured to truncate a metal gate stack into multiple portions. In this regard, the dielectric helmet 214 may be patterned to form one or more gate isolation features (or a gate cut feature) that are self-aligned with the underlying dielectric structure 211 and between adjacent fins 204.

Figure 6B:
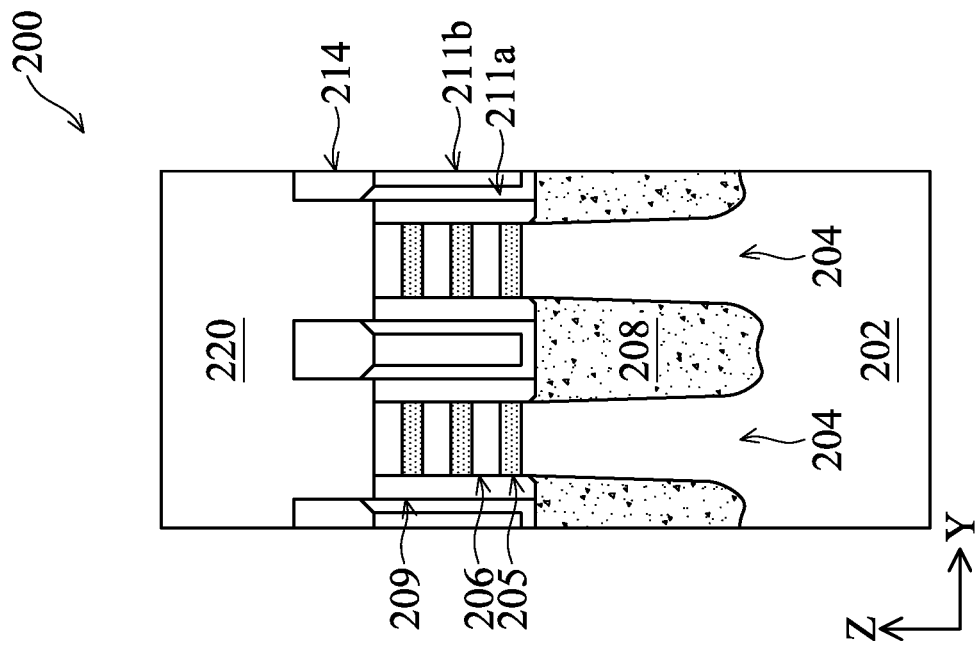
Figure 6A:
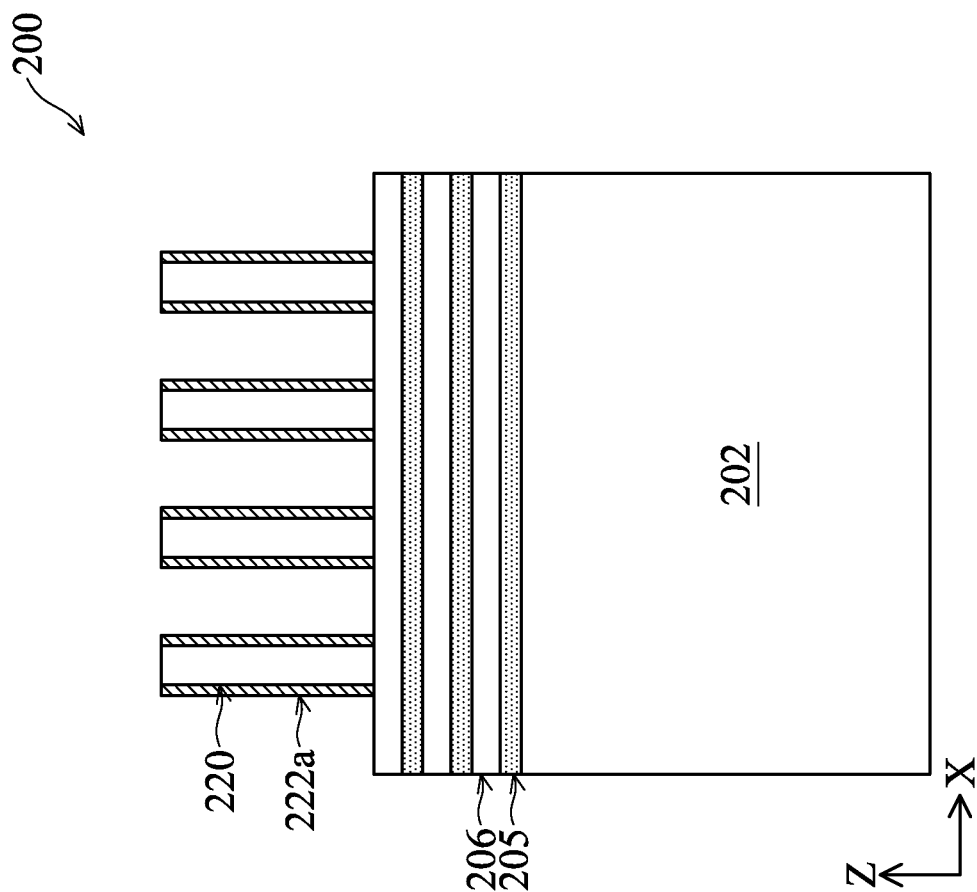

Now referring to FIGS. 6A and 6B, method 100 at operation 108 forms dummy gate stacks 220 over channel regions of the fins 204, thereby covering the dielectric helmet 214. Each dummy gate stack 220 may include a dummy gate electrode (not depicted) disposed over an optional dummy gate dielectric layer and/or an interfacial layer (not depicted). In the present embodiments, at least portions of each dummy gate stack 220 are to be replaced with a metal gate stack. The dummy gate stacks 220 may be formed by a series of deposition and patterning processes. For example, the dummy gate stacks 220 may be formed by depositing a polysilicon (poly-Si) layer over the fins 204 and subsequently patterning the poly-Si layer via a series of photolithography and etching processes (e.g., a dry etching process). To accommodate the patterning process and protect the dummy gate stacks 220 during subsequent fabrication processes, one or more hard mask layers (not depicted) may be formed over the dummy gate stacks 220.

Still referring to FIGS. 6A and 6B, method 100 forms top gate spacers 222a on sidewalls of each dummy gate stack 220. The top gate spacers 222a may include a single-layer structure or a multi-layer structure and may include SiO and/or $SiO_2$, SiN, SiC, SiON, SiOC, SiCN, air, a low-k dielectric material, a high-k dielectric material (e.g., hafnium oxide ($HfO_2$), lanthanum oxide ($La_2O_3$), etc.), other suitable materials, or combinations thereof. Each spacer layer of the top gate spacers 222a may be formed by first depositing a dielectric layer over the dummy gate stacks 220 via a suitable deposition method (e.g., CVD and/or ALD) and subsequently removing portions of the dielectric layer in an anisotropic (e.g., directional) etching process (e.g., a dry etching process), leaving the top gate spacers 222a on the sidewalls of each dummy gate stack 220.

Referring to FIGS. 7A and 7B, method 100 at operation 110 forms epitaxial S/D features 224 in the fins 204 adjacent to each dummy gate stack 220. In the present embodiments, method 100 forms the epitaxial S/D features 224 by first forming S/D recesses (not depicted) in the S/D regions of the fins 204, forming inner gate spacers 222b on sidewalls of the non-channel layers 205 that are exposed in the S/D recesses, and forming epitaxial S/D features 224 in the S/D recesses.

In the present embodiments, method 100 forms the S/D recesses by implementing an etching process that selectively removes portions of the fins 204 in the S/D regions without removing, or substantially removing, the dummy gate stacks 220 and the isolation features 208. In some embodiments, the etching process is a dry etching process employing a suitable etchant capable of removing Si (i.e., the channel layers 206) and SiGe (i.e., the non-channel layers 205) of the ML. In some examples, the dry etchant may be a chlorine-containing etchant including $Cl_2$, $SiCl_4$, $BCl_3$, other chlorine-containing gas, or combinations thereof. A cleaning process may subsequently be performed to clean the S/D recesses with a hydrofluoric acid (HF) solution or other suitable solution.

The inner gate spacers 222b may be a single-layer structure or a multi-layer structure and may include silicon oxide, SiN, SiCN, SiOC, SiON, SiOCN, a low-k dielectric material, air, a high-k dielectric material (e.g., $HfO_2$, $La_2O_3$, etc.), other suitable dielectric material, or combination thereof. In some embodiments, the inner gate spacers 222b have a composition different from that of the top gate spacers 222a. Forming the inner gate spacers 222b may include selectively removing portions of the non-channel layers 205 exposed in the S/D recesses without removing, or substantially removing, portions of the channel layers 206 to form trenches (not depicted). The non-channel layers 205 may be etched by a dry etching process. Subsequently, one or more dielectric layers are formed in the trenches, followed by one or more etching processes to remove (i.e., etch back) excess dielectric layer(s) deposited on surfaces of the channel layers 206, thereby forming the inner gate spacers 222b as depicted in FIG. 7A. The one or more dielectric layers may be deposited by any suitable method, such as ALD, CVD, physical vapor deposition (PVD), other suitable methods, or combinations thereof.

Each of the epitaxial S/D features 224 may be suitable for forming a p-type FET device (i.e., including a p-type epitaxial material) or, alternatively, an n-type FET device (i.e., including an n-type epitaxial material). The p-type epitaxial material may include one or more epitaxial layers of silicon germanium (epi SiGe) each doped with a p-type dopant such as boron, germanium, indium, gallium, other p-type dopants, or combinations thereof. The n-type epitaxial material may include one or more epitaxial layers of silicon (epi Si) or silicon carbon (epi SiC) each doped with an n-type dopant such as arsenic, phosphorus, other n-type dopants, or combinations thereof. In some embodiments, one or more epitaxy growth processes are performed to grow an epitaxial material in each S/D recess and over the inner gate spacers 222b. For example, method 100 may implement an epitaxy growth process similar to that discussed above with respect to forming the ML. In some embodiments, the epitaxial material is doped in-situ by adding a dopant to a source material during the epitaxial growth process. In some embodiments, the epitaxial material is doped by an ion implantation process after performing the deposition process. In some embodiments, an annealing process is subsequently performed to activate the dopants in the epitaxial S/D features 224.

Figure 7C:
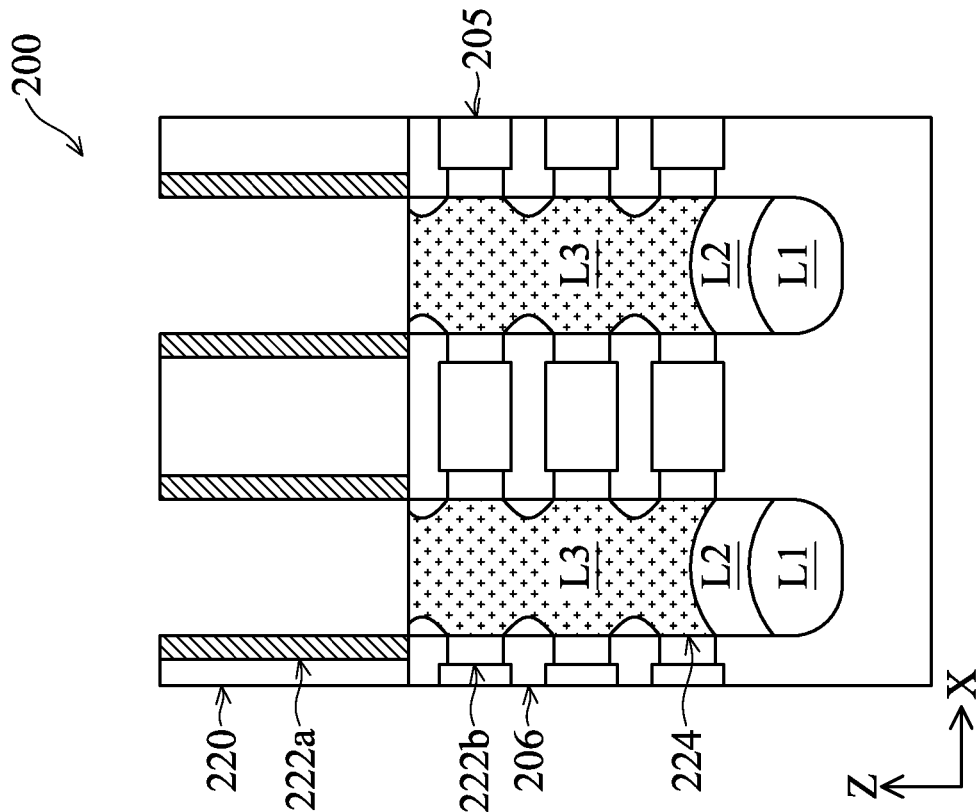
Figure 7D:
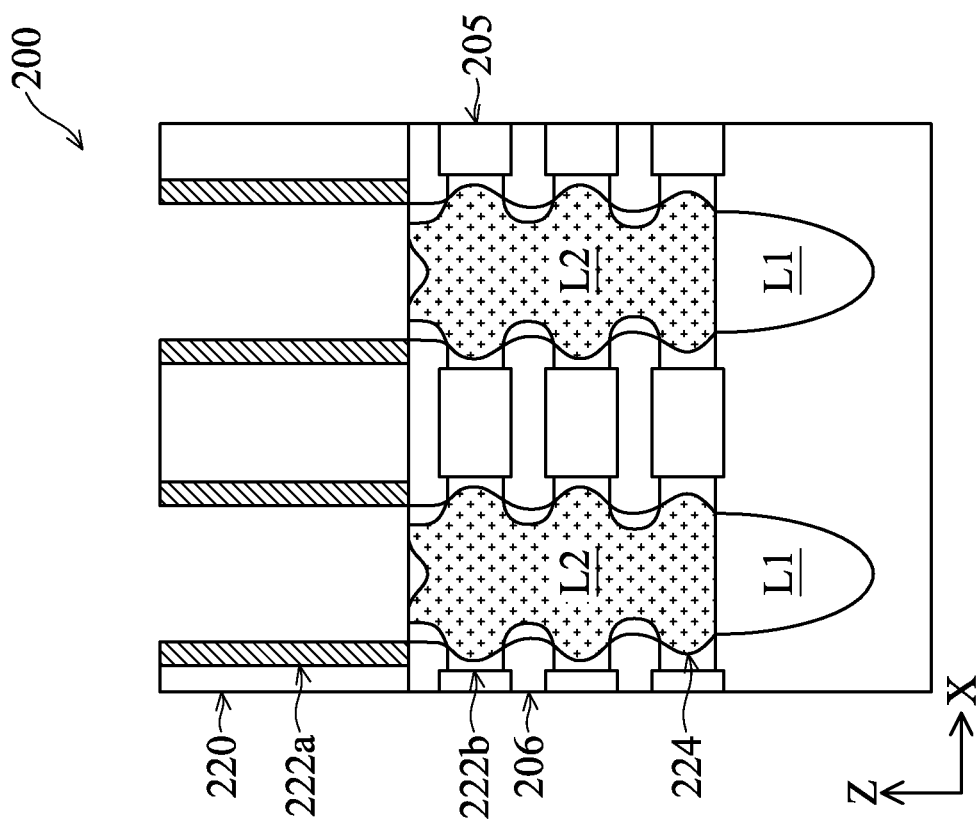

It is noted that the embodiments of the epitaxial S/D features 224 are not limited to that depicted in FIG. 7A, and each epitaxial S/D feature 224 may include multiple epitaxial material layers having different dopant concentrations. For example, referring to FIGS. 7C and 7D, which each illustrate a portion of the structure 200 as depicted in FIG. 7A, the epitaxial S/D feature 224 may include two epitaxial material layers (e.g., L1 and L2 depicted in FIG. 7C) or three epitaxial material layers (e.g., L1, L2, and L3 as depicted in FIG. 7D). The epitaxial S/D feature 224 may include more or less of epitaxial material layers depending on various design requirements. In some embodiments, different epitaxial material layers include different dopant concentrations. In one example, referring to FIG. 7C, concentration of a dopant in the layer L2 is greater than that of L1. In another example, referring to FIG. 7D, concentration of a dopant in each of the layers L2 and L3 may be greater than that of L1. Examples of the types and compositions of the dopants are discussed in detail above.

Thereafter, referring to FIGS. 8A and 8B, method 100 at operation 112 patterns the dielectric helmet 214. Before patterning the dielectric helmet 214, method 100 first forms an etch-stop layer (ESL) 230 over the structure 200 to protect the underlying components, such as the epitaxial S/D features 224, during subsequent fabrication processes. The ESL 230 may include any suitable dielectric material, such as SiN, SiCN, $Al_2O_3$, other suitable materials, or combinations thereof, and may be formed by CVD, ALD, PVD, other suitable methods, or combinations thereof. In the present embodiments, the ESL 230 provides etching selectivity with respect to its surrounding dielectric components to ensure protection against inadvertent damage to these components. Method 100 then forms an interlayer dielectric (ILD) layer 232 over the ESL 230 to fill the space between adjacent dummy gate stacks 220. The ILD layer 232 may include SiO and/or $SiO_2$, a low-k dielectric material, TEOS, doped silicon oxide (e.g., BPSG, FSG, PSG, BSG, etc.), other suitable dielectric materials, or combinations thereof, and may be formed by any suitable method, such as CVD, FCVD, SOG, other suitable methods, or combinations thereof. Method 100 subsequently performs one or more CMP process to expose top surfaces of the dummy gate stacks 220.

Method 100 may then recess portions of the dummy gate stacks 220 and the top gate spacers 222a. Subsequently, method 100 patterns the dielectric helmet 214 by forming a patterned masking element (not depicted) to expose portions of the dummy gate stack 220 engaged with (or surrounding) portions of the dielectric helmet 214 to be removed. The patterned masking element includes at least a photoresist layer capable of being patterned by a series of photolithography and etching processes discussed in detail above with respect to patterning the fins 204. The present embodiments do not limit the dimension of the patterned masking element, so long as it completely covers the portions of the dielectric helmet 214 to remain in the structure 200 and become gate isolation feature(s) for the subsequently-formed metal gate stack.

Thereafter, method 100 removes portions of the dummy gate stacks 220 exposed by the patterned masking element to expose portions of the dielectric helmet 214 in an etching process (e.g., a dry etching process). In some embodiments, the etching process needs not to completely remove the exposed portions of the dummy gate stacks 220, and the extent of such removal is controlled by adjusting the duration of the etching process. After implementing the etching process, the patterned masking element is removed from the structure 200 by any suitable method, such as resist stripping and/or plasma ashing. The exposed portions of the dielectric helmet 214 are then selectively removed with respect to the dummy gate stacks 220 in a suitable etching process (e.g., a dry etching process) to form the patterned dielectric helmet 214. In some embodiments, operation 112 is optional and the dielectric helmet 214 is patterned at a subsequent operation.

At operation 114, still referring to FIGS. 8A and 8B, method 100 performs an etching process to remove the remaining portions of the dummy gate stacks 220, thereby forming gate trenches 246 between the top gate spacers 222a. The etching process may be a dry etching process, a wet etching process, an RIE process, other suitable processes, or combinations thereof.

Collectively referring to FIGS. 9A-11B, method 100 at operation 116, 118, and 120 removes the cladding layers 209 and the non-channel layers 205 to form openings in which a metal gate stack is subsequently formed. In the present embodiments, method 100 implements three separate etching processes to form the openings.

At operation 116, referring to FIGS. 9A and 9B, method 100 performs an etching process 302 to remove the cladding layers 209 from the structure 200, resulting in trenches (or openings) 248 between each fin 204 and the dielectric structure 211. In the present embodiments, referring to FIG. 9B, each trench 248 extends along a sidewall of the fin 204, where a depth D1 of each trench 248 is substantially the same as a height of the ML. In some examples, the depth D1 may be about 50 nm to about 60 nm.

In the present embodiments, the etching process 302 selectively removes the cladding layers 209 without removing, or substantially removing the channel layers 206 and the dielectric structure 211. In some instances, the non-channel layers 205 may be slightly recessed by the etching process 302 but remain substantially intact between the channel layers 206. In some embodiments, the etching process 302 is a dry etching process. In further embodiments, the etching process 302 implements a fluorine-containing etchant, such as hydrofluoric acid (HF), $F_2$, other fluorine-containing etchants (e.g., $CF_4$, $CHF_3$, $CH_3F$, etc.), or combinations thereof.

At operation 118, referring to FIGS. 10A and 10B, method 100 performs an etching process 304 to vertically extend the trenches 248. In the present embodiments, referring to FIG. 10B, the etching process 304 removes a portion of the isolation features 208, resulting in trenches (or openings) 249 that extends to below the bottommost non-channel layer 205 of the ML and exposes a portion of a sidewall of the fin 204 below the ML. In some embodiments, a depth D2 of the trenches 249 is less than the depth D1 and may be about 10 nm to about 20 nm. In this regard, the depth D2 reflects an extent of over-etching of the isolation features 208. In some embodiments, a bottom surface of the trenches 249 is substantially leveled with a bottom surface of the epitaxial S/D features 224, which is a top surface of the recessed fin 204 in the S/D region (see FIG. 11D). In some embodiments, referring to FIG. 10A, a sum of the depths D1 and D2 is approximately the same as a height D3 of the epitaxial S/D features 224.

In the present embodiments, the etching process 304 selectively removes the isolation features 208 without removing, or substantially removing the ML, the substrate 202, and the dielectric structure 211. In some embodiments, the etching process 304 is a dry etching process. In further embodiments, the etching process 304 implements an etchant that is different from that of the etching process 302. In one such example, the etchant may include HF, ammonia ($NH_3$), or a combination thereof. In the present embodiments, the depth D2 of the trenches 249 is adjusted by controlling a duration of the etching process 304.

Figure 11B:
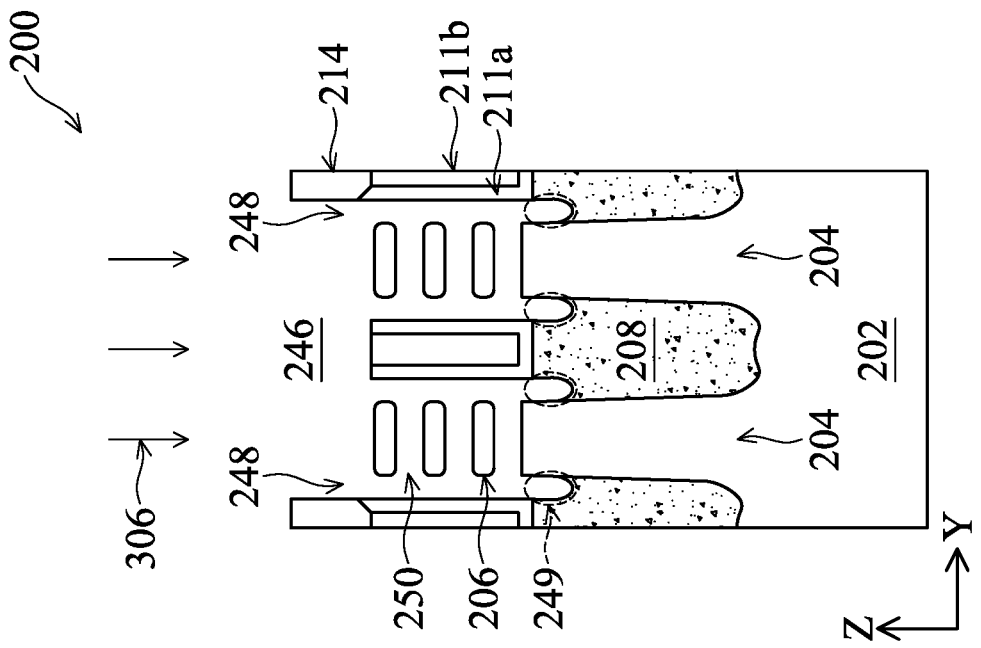
Figure 11A:
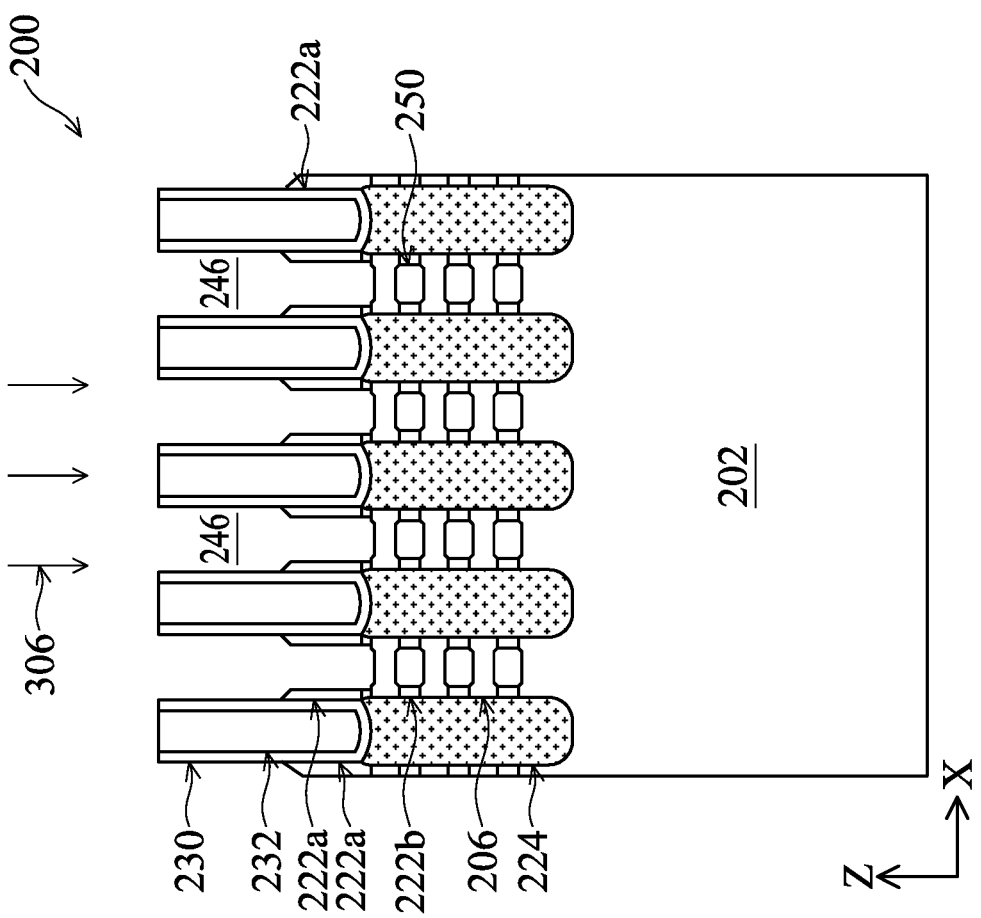
Figures 1, 2, 11C, 11D:
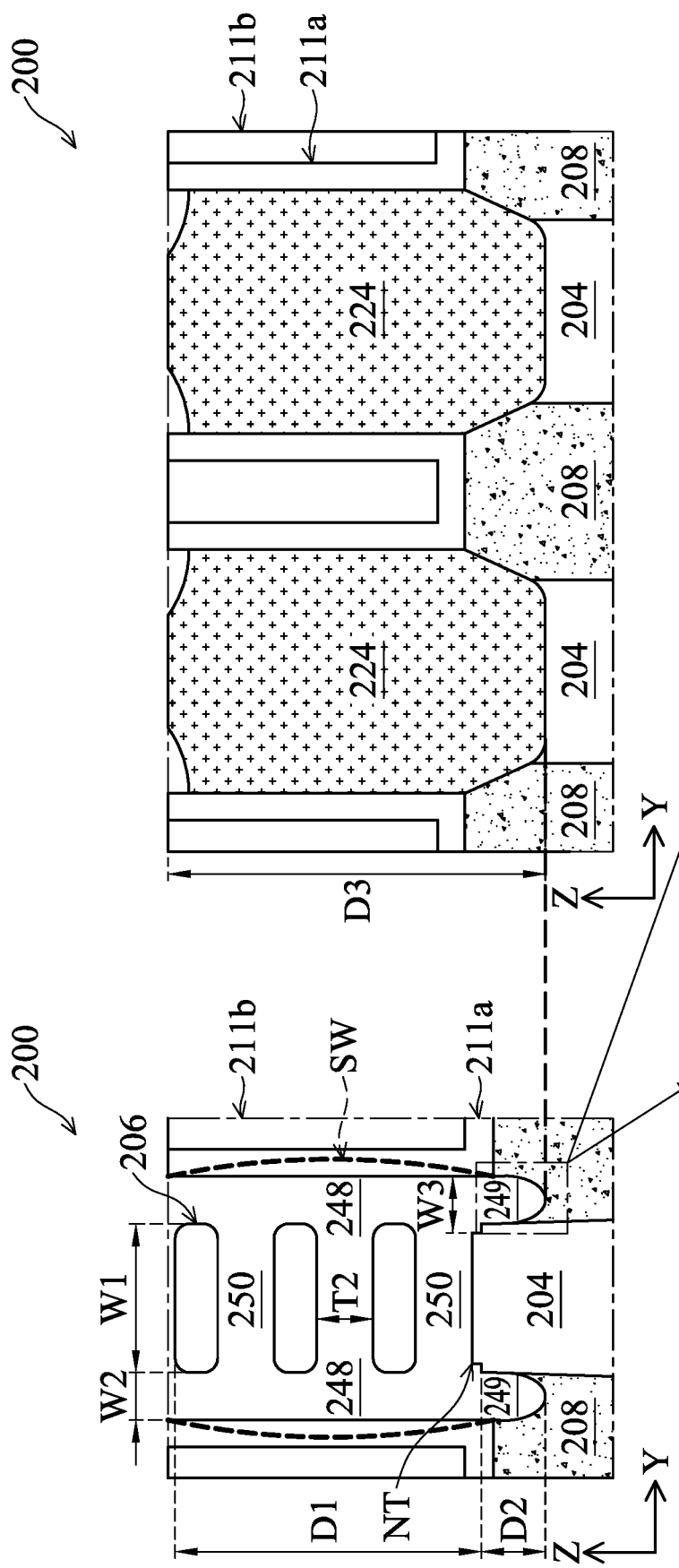

Now referring to FIGS. 11A and 11B, method 100 at operation 120 performs an etching process 306 to remove the non-channel layers 205 from the ML, resulting in openings 250 between the channel layers 206 and the inner gate spacers 222b. In other words, the openings 250 are interleaved with the channel layers 206. Accordingly, the etching process 306 may be considered a sheet formation, or sheet release, process. In the present embodiments, the etching process 306 selectively removes the non-channel layers 205 without removing, or substantially removing, the channel layers 206, the dielectric structure 211, and the isolation features 208. The etching process 306 may be a dry etching process, a wet etching process, an RIE process, other suitable processes, or combinations thereof. In some embodiments, the etching process 306 is a dry etching process. For embodiments in which the cladding layers 209 and the non-channel layers 205 have similar or the same compositions, the etching process 306 implements an etchant similar to or the same as that of the etching process 302 discussed in detail above.

FIGS. 11C and 11D detail the various dimensions of the structure 200 following the removals of the cladding layers 209 and the non-channel layers 205. As discussed above, the depth D2 of the trench 249 is less than the depth D1 of the trench 248. In some examples, a ratio of the depth D1 to the depth D2 may be about 2.5 to about 6. In some examples, the depth D1 may be about 50 nm to about 60 nm, the depth D2 may be about 10 nm to about 20 nm, and the height D3 may be about 60 nm to about 80 nm.

In some embodiments, the opening of the trench 249, which is defined by a width W3, is substantially the same as the opening of the trench 248, which is defined by a width W2. In some examples, the width W2 (or W3) may be about 13 nm to about 16 nm. In further examples, a ratio of the width W3 to the depth D2 may be about 1:1. In some instances, a greater width W2 may allow a greater amount of the isolation features 208 to be removed during the etching process 304, thereby extending the depth D2. In some instances, the etching process 304 may remove a portion of the fin 204, creating notches NT at the opening of the trench 249, which may cause the width W3 to be larger than the width W2.

In some embodiments, sidewalls SW of the trench 248 may be substantially vertical along the Z axis. In some embodiments, as indicated by the dashed line in FIG. 11C, the sidewalls SW are curved or bowed outward, which may be attributed to surface roughness of the sub-layer 211a that includes, for example, SiCN.

In some embodiments, referring to an enlarged view 11C-1 of the trench 249 as depicted in FIG. 11C, the bottom surface of the trench 249 is curved and the curvature may be defined by a radius R of about 6 nm to about 7 nm, which is at least about one half of the width W3. In some embodiments, the curvature of the bottom surface of the trench 249 is further defined by a tangential angle α, which may be about 20° to about 60°. In some embodiments, referring to an enlarged view 11C-2, the bottom surface of the trench 249 is substantially flat, such that the tangential angle α is substantially 0°. The degree of curvature of the bottom surface of the trench 249 may be fine-tuned by adjusting various parameters of the etching process 304, such as the type of etchant used and the power or bias applied during the etching process.

In the present embodiments, the trench 249 extend to about the same, or substantially the same, level as the bottom surface of the epitaxial S/D features 224. In the present embodiments, extending the trenches 249 to approximately the same level as the bottom surface of the epitaxial S/D features 224 ensures sufficient coverage by the subsequently-formed metal gate stack, thereby reducing leakage at the bottommost NS device. Accordingly, if the trenches 249 extend to above the bottom surface of the epitaxial S/D features 224, coverage of the channel regions by the subsequently-formed metal gate stack may be insufficient; the other hand, if the trenches 249 extend to below the bottom surface of the epitaxial S/D features 224 (e.g., through an anti-punch through, or APT, region in the substrate 202; not depicted), additional leakage may be induced that negatively impacts the device performance.

The bottommost NS device in an ML may generally experience poor gate control leading to leakage issues. In some instances, stacks with smaller widths may lead to worse leakage in the bottommost NS device than stacks with larger widths due to light dopant present at the bottom of the stack. Additionally, as device spacing (such as between an n-type FET and a p-type FET) becomes smaller, diffusion area becomes closer to the channel region and may also impact the device leakage issues. To remedy these and other issues, the present disclosure provides a method of forming NS FETs with enhanced gate control by enlarging a contact area between the metal gate stack and the channel region (i.e., the channel layers of the stack). In the present embodiments, enlarging the contact area includes performing an over-etching process after removing the cladding layers 209, such that the subsequently-formed metal gate stack extends to below the top surface of the isolation features 208 and is in direct contact with the sidewalls of portions of the fins 204 below the ML.

Figures 12A, 12B:
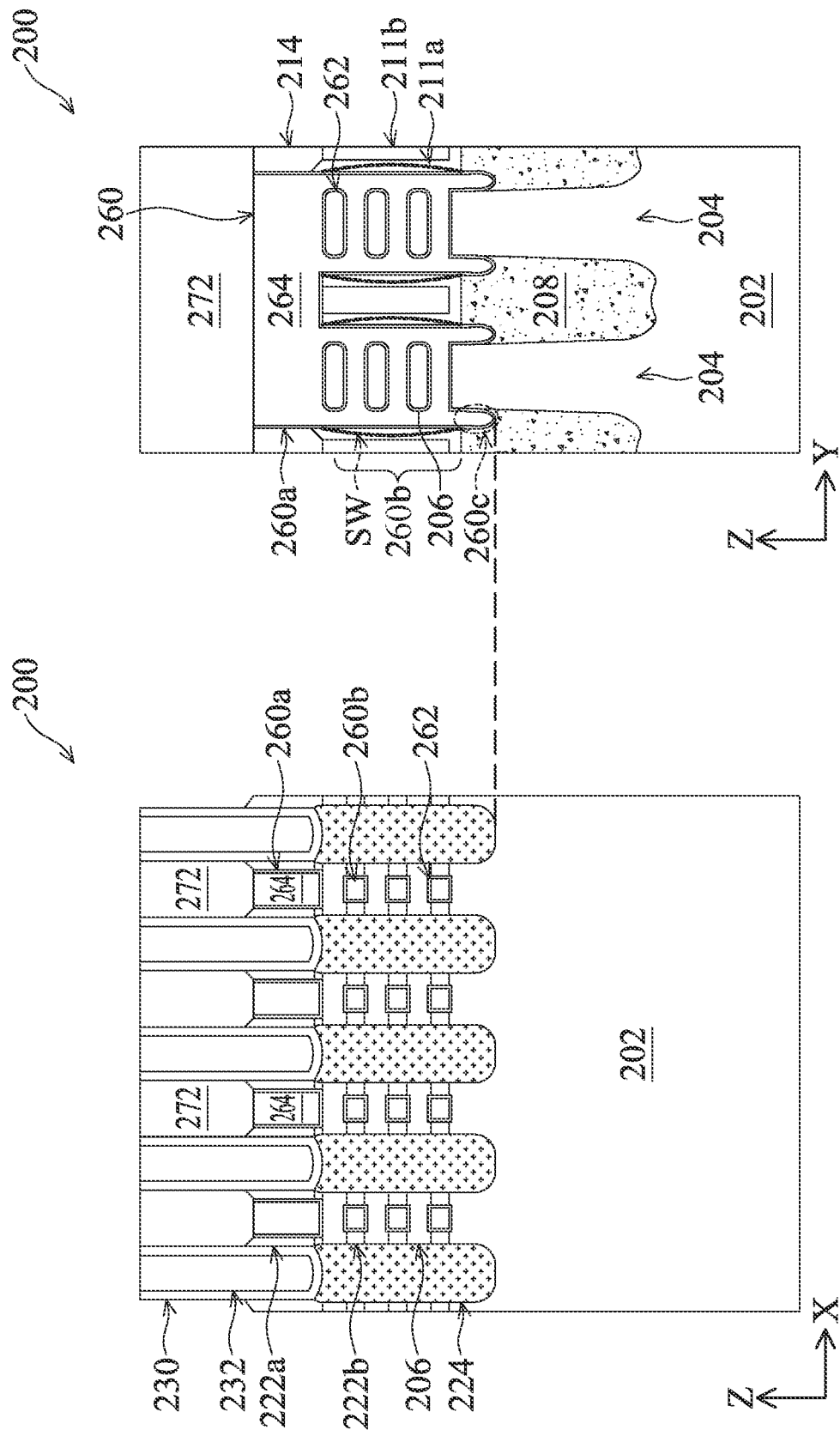

At operation 122, referring to FIGS. 12A and 12B, method 100 forms a metal gate stack 260 in the gate trenches 246, the trenches 248, the trenches 249, and the openings 250. In the present embodiments, the metal gate stack 260 includes a first portion 260a that fills the gate trenches 246 (i.e., between the top gate spacers 222a), a second portion 260b that fills the trenches 248 and the openings 250, and a third portion 260c that fills the trenches 249. Accordingly, the metal gate stack 260 contacts the sidewalls of the fins 204, wraps around (or interleaved with) each channel layer 206, and extend along the sidewalls of the fins 204 to below a top surface of the isolation features 208. In some embodiments, the sidewalls SW of the trench 248 are bowed outward as indicated by the dashed line in FIG. 12B (also see FIG. 11C) and discussed in detail above with respect to FIG. 11C. In the present embodiments, the third portion 260c increases the coverage of the sidewalls of the fin 204 by the metal gate stack 260, thereby improving the gate control of the NS FET formed at the bottom of the ML.

In the present embodiments, the metal gate stack 260 includes a gate dielectric layer 262 and a metal gate electrode 264 over the gate dielectric layer 262. The gate dielectric layer 262 may include a high-k dielectric material, such as $HfO_2$, $La_2O_3$, other suitable materials, or combinations thereof. The metal gate electrode 264 includes at least one work function metal layer and a bulk conductive layer disposed thereover. The work function metal layer may be a p-type or an n-type work function metal layer. Example work function metals include TiN, TaN, WN, $ZrSi_2$, $MoSi_2$, $TaSi_2$, $NiSi_2$, Ti, TaAl, TaAlC, TiAlN, TaC, TaCN, TaSiN, other suitable work function metals, or combinations thereof. The bulk conductive layer may include Co, W, Ru, Cu, Al, Ti, Ni, Au, Pt, Pd, other suitable materials, or combinations thereof. The metal gate stack 260 may further include other material layers (not depicted), such as an interfacial layer disposed on surfaces of the channel layers 206, a capping layer, a barrier layer, other suitable layers, or combinations thereof. Various layers of the metal gate stack 260 may be formed by various methods including, for example, ALD, CVD, PVD, plating, other suitable methods, or combinations thereof. After forming the bulk conductive layer, one or more CMP processes are performed to remove excessive material formed on top surface of the ILD layer 232, thereby planarizing the structure 200.

In some embodiments, still referring to FIGS. 12A and 12B, method 100 subsequently recesses the metal gate stack 260 to expose the remaining portions of the dielectric helmet 214. The etching process may be implemented by any suitable method, including a dry etching process, a wet etching process, RIE, other suitable methods, or combinations thereof, utilizing one or more etchant configured to etch components of the metal gate stack 260. In some embodiments, the etching process is controlled to recess the metal gate stack 260 such that a top surface of the recessed metal gate stack 260 is below a top surface of the remaining portions of the dielectric helmet 214, which serve as the gate isolation features for separating the metal gate stack 260. Thereafter, method 100 deposits a dielectric layer 272 over the structure 200 to fill the trench. In some embodiments, the dielectric layer 272 is configured to provide self-alignment capability and etching selectivity during subsequent fabrication processes including, for example, patterning the ILD layer 232 to form S/D contact openings (not depicted) over the epitaxial S/D features 224. Accordingly, in the present embodiments, the dielectric layer 272 has a composition different from that of the ILD layer 232. In some embodiments, the dielectric layer 272 includes SiN, SiCN, SiOC, SiON, SiOCN, SiO and/or $SiO_2$, other suitable materials, or combinations thereof. The dielectric layer 272 may be deposited by any suitable method, such as ALD, CVD, PVD, other suitable methods, or combinations thereof. Subsequently, method 100 removes portions of the dielectric layer 272 formed over the ILD layer 232 in one or more CMP process, thereby planarizing the top surface of the structure 200.

Thereafter, method 100 at operation 132 performs additional fabrication processes to the structure 200, such as forming a multi-layer interconnect (MLI) structure (not depicted) thereover. The MLI may include various interconnect features, such as vias and conductive lines, disposed in dielectric layers, such as ESLs and ILD layers. In some embodiments, the vias are vertical interconnect features configured to interconnect a device-level contact, such as an S/D contact (not depicted) or a gate contact (not depicted), with a conductive line or interconnect different conductive lines, which are horizontal interconnect features. The ESLs and the ILD layers of the MLI may have substantially same compositions as those discussed above with respect to the ESL 230 and the ILD layer 232, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises TiN and/or TaN.

Although not intended to be limiting, one or more embodiments of the present disclosure provide many benefits to a semiconductor device and the formation thereof. For example, the present disclosure provides a method of forming NS FETs with enhanced gate control by enlarging coverage of the channel regions (e.g., the channel layers 206) of the fin (e.g., the fin 204) by the metal gate stack. In the present embodiments, such enlargement of gate coverage includes performing an over-etching process after removing sacrificial cladding layers (e.g., the cladding layers 209) from sidewalls of the ML, such that the subsequently-formed metal gate stack extends to below a top surface of the isolation features (e.g., isolation features 208) disposed adjacent to the fin and is in direct contact with the sidewalls of portions of the fin below the ML. Embodiments of the disclosed methods can be readily integrated into existing processes and technologies for manufacturing NS FETs and/or other suitable multi-gate devices.

In one aspect, the present disclosure provides a method that includes forming a fin structure having a stack of alternating first semiconductor layers and second semiconductor layers over a substrate, forming cladding layers along sidewalls of the fin structure, forming a dummy gate stack over the cladding layers, and forming S/D features in the fin structure and adjacent to the dummy gate stack. The method further includes removing the dummy gate stack to form a gate trench adjacent to the S/D features, removing the cladding layers to form first openings along the sidewalls of the fin structure, where the first openings extend to below the stack, removing the first semiconductor layers to form second openings between the second semiconductor layers and adjacent to the first openings, and subsequently forming a metal gate stack in the gate trench, the first openings, and the second openings.

In another aspect, the present disclosure provides a method that includes forming fins protruding from a substrate, where each fin includes a multi-layer stack (ML) of alternating channel layers and non-channel layers and where the fins are separated by isolation features over the substrate, forming cladding layers along sidewalls of each fin, forming a dummy gate stack over a channel region of the fins, and forming S/D features in the fin and adjacent to the dummy gate stack. The method further includes removing the dummy gate stack to form a first trench adjacent to the S/D features, performing a first etching process to remove the cladding layers, resulting in second trenches, performing a second etching process to remove a portion of the isolation features, thereby extending the second trenches, performing a third etching process to remove the non-channel layers, resulting in openings that connect adjacent second trenches, and subsequently forming a metal gate stack in the first trench, the second trenches, and the openings.

In yet another aspect, the present disclosure provides a semiconductor structure that includes a substrate, a fin including a stack of semiconductor layers disposed over the substrate, isolation features over the substrate and surrounding a bottom portion of the fin, and a metal gate stack disposed over the stack of semiconductor layers, wherein a bottom portion of the metal gate stack extends along sidewalls of the fin to below a top surface of the isolation features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin structure having a stack of alternating first semiconductor layers and second semiconductor layers over a substrate;
    forming cladding layers along sidewalls of the fin structure;
    forming a dummy gate stack over the cladding layers;
    forming source/drain (S/D) features in the fin structure and adjacent to the dummy gate stack;
    removing the dummy gate stack to form a gate trench adjacent to the S/D features;
    removing the cladding layers to form first openings along the sidewalls of the fin structure, wherein the first openings extend to below the stack;
    removing the first semiconductor layers to form second openings between the second semiconductor layers and adjacent to the first openings; and
    forming a metal gate stack in the gate trench, the first openings, and the second openings.

2. The method of claim 1, wherein the extension of the first openings below the stack is less than a height of the stack.

3. The method of claim 1, further comprising forming isolation features that surround a bottom portion of the fin structure, wherein removing the cladding layers includes:
    performing a first etching process to remove the cladding layers, resulting in the first openings; and
    performing a second etching process remove top portions of the isolation features, thereby extending the first openings to below the stack.

4. The method of claim 3, wherein the first etching process and the second etching process implement different etchants.

5. The method of claim 3, wherein removing the first semiconductor layers implements an etchant that is the same as the first etching process.

6. The method of claim 1, wherein a depth of each first opening is substantially the same as a height of each S/D feature.

7. The method of claim 1, wherein forming the metal gate stack in the first openings results in a portion of the metal gate stack extending to contact a sidewall of a portion of the fin structure below the stack.

8. A method, comprising:
forming fins protruding from a substrate, wherein each fin includes a multi-layer stack (ML) of alternating channel layers and non-channel layers, and wherein the fins are separated by isolation features over the substrate;
forming cladding layers along sidewalls of each fin;
forming a dummy gate stack over a channel region of the fins;
forming source/drain (S/D) features in the fin and adjacent to the dummy gate stack;
removing the dummy gate stack to form a first trench adjacent to the S/D features;
performing a first etching process to remove the cladding layers, resulting in second trenches;
performing a second etching process to remove a portion of the isolation features, thereby extending the second trenches;
performing a third etching process to remove the non-channel layers, resulting in openings that connect adjacent second trenches; and
forming a metal gate stack in the first trench, the second trenches, and the openings.

9. The method of claim 8, wherein the non-channel layers and the cladding layers both include SiGe, such that the first etching process and the third etching process implement the same etchant.

10. The method of claim 9, wherein the first etching process and the third etching process each implements a fluorine-containing etchant.

11. The method of claim 8, wherein the first etching process and the second etching process implement different etchants.

12. The method of claim 11, wherein the second etching process implements an etchant that includes ammonia ($NH_3$).

13. The method of claim 8, wherein the first etching process results in the second trenches to have a first depth, wherein the second etching process extends the second trenches by a second depth, and wherein the second depth is less than the first depth.

14. The method of claim 8, wherein a bottom surface of the extended second trenches is substantially leveled with a bottom surface of the S/D features.

15. A semiconductor structure, comprising:
a substrate;
a fin including a fin base protruding from the substrate and a stack of semiconductor layers disposed over the fin base;
isolation features over the substrate and surrounding the fin base; and
a metal gate stack disposed over the stack of semiconductor layers, wherein a bottom portion of the metal gate stack extends along sidewalls of the fin base to below a top surface of the isolation features, and
wherein the bottom portion of the metal gate stack is disposed below a top surface of the fin base.

16. The semiconductor structure of claim 15, further comprising a source/drain (S/D) feature disposed in the fin and adjacent to the metal gate stack, wherein a bottom surface of the S/D feature is substantially leveled with a bottom surface of the metal gate stack.

17. The semiconductor structure of claim 15, wherein the metal gate stack includes a top portion and a middle portion disposed over the bottom portion, wherein the top portion is disposed over a top surface of the stack of semiconductor layers, and wherein the middle portion is interleaved with the stack of semiconductor layers.

18. The semiconductor structure of claim 17, wherein the middle portion is defined by a first depth and the bottom portion is defined by a second depth, wherein the second depth is less than the first depth.

19. The semiconductor structure of claim 18, wherein a ratio of the second depth to the first depth is about 2.5 to about 6.

20. The semiconductor structure of claim 15, further comprising a dielectric structure disposed over the isolation features and adjacent to the metal gate stack, wherein the dielectric structure extends along a sidewall of the metal gate stack.

\* \* \* \* \*